United States Patent
Petersen et al.

(10) Patent No.: US 8,962,361 B2
(45) Date of Patent: Feb. 24, 2015

(54) METHOD FOR PRODUCING A SEMICONDUCTOR CHIP EMITTING RADIATION, SEMICONDUCTOR CHIP EMITTING RADIATION, AND COMPONENT EMITTING RADIATION

(75) Inventors: Kirstin Petersen, Regensburg (DE); Frank Baumann, Regensburg (DE); Dominik Eisert, Regensburg (DE); Hailing Cui, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 22 days.

(21) Appl. No.: 13/991,408

(22) PCT Filed: Nov. 23, 2011

(86) PCT No.: PCT/EP2011/070863
§ 371 (c)(1),
(2), (4) Date: Aug. 14, 2013

(87) PCT Pub. No.: WO2012/072471
PCT Pub. Date: Jun. 7, 2012

(65) Prior Publication Data
US 2014/0008683 A1    Jan. 9, 2014

(30) Foreign Application Priority Data
Dec. 3, 2010  (DE) .......................... 10 2010 053 362

(51) Int. Cl.
*H01L 21/00*  (2006.01)
*H01L 33/50*  (2010.01)

(52) U.S. Cl.
CPC .............. *H01L 33/50* (2013.01); *H01L 33/504* (2013.01); *H01L 33/505* (2013.01); *H01L 2933/0041* (2013.01); *H01L 2924/0002* (2013.01)
USPC ..................................... 438/29; 257/E33.061

(58) Field of Classification Search
USPC ...................................................... 438/28, 35
See application file for complete search history.

(56) References Cited

U.S. PATENT DOCUMENTS

| | | | |
|---|---|---|---|
| 6,482,664 B1 * | 11/2002 | Lee et al. | 438/28 |
| 7,223,620 B2 * | 5/2007 | Jager et al. | 438/27 |
| 7,371,593 B2 * | 5/2008 | Harada | 438/26 |
| 7,772,769 B2 | 8/2010 | Maeda et al. | |
| 2003/0080341 A1 | 5/2003 | Sakano et al. | |
| 2003/0132701 A1 | 7/2003 | Sato et al. | |
| 2006/0073625 A1 | 4/2006 | Harada | |

(Continued)

FOREIGN PATENT DOCUMENTS

| | | | |
|---|---|---|---|
| DE | 101 09 349 A1 | 9/2002 | |
| DE | 102 61 428 A1 | 7/2004 | |

(Continued)

*Primary Examiner* — Chandra Chaudhari
(74) *Attorney, Agent, or Firm* — Slater & Matsil, L.L.P.

(57) ABSTRACT

A method is provided for producing a radiation-emitting semiconductor chip, in which a first wavelength-converting layer is applied over the radiation exit face of a semiconductor body. The application method is selected from the following group: sedimentation, electrophoresis. In addition, a second wavelength-converting layer is applied over the radiation exit face of the semiconductor body. The second wavelength-converting layer is either produced in a separate method step and then applied or the application method is sedimentation, electrophoresis or printing. Furthermore, a radiation-emitting semiconductor chip and a radiation-emitting component are provided.

17 Claims, 5 Drawing Sheets

(56) References Cited

U.S. PATENT DOCUMENTS

| | | |
|---|---|---|
| 2007/0228933 A1 | 10/2007 | Maruyama et al. |
| 2008/0122343 A1 | 5/2008 | Maruyama et al. |
| 2009/0039762 A1 | 2/2009 | Park et al. |
| 2009/0057690 A1 | 3/2009 | Chakraborty |
| 2009/0236622 A1 | 9/2009 | Nishihara |
| 2009/0261366 A1 | 10/2009 | Eisert et al. |
| 2010/0181582 A1 | 7/2010 | Li et al. |
| 2011/0116263 A1 | 5/2011 | Cillessen et al. |

FOREIGN PATENT DOCUMENTS

| | | |
|---|---|---|
| DE | 10 2007 057 710 A1 | 4/2009 |
| TW | 595012 B | 6/2004 |
| TW | 200717879 | 5/2007 |
| TW | 201023405 A | 6/2010 |

* cited by examiner

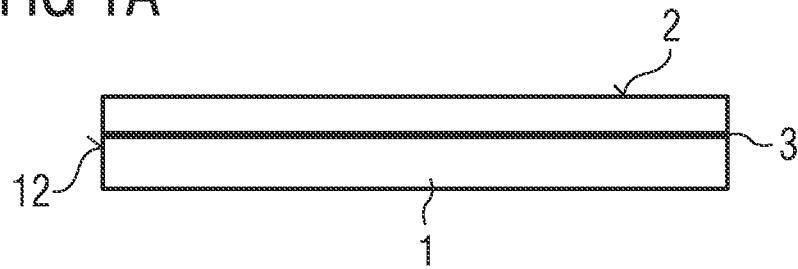
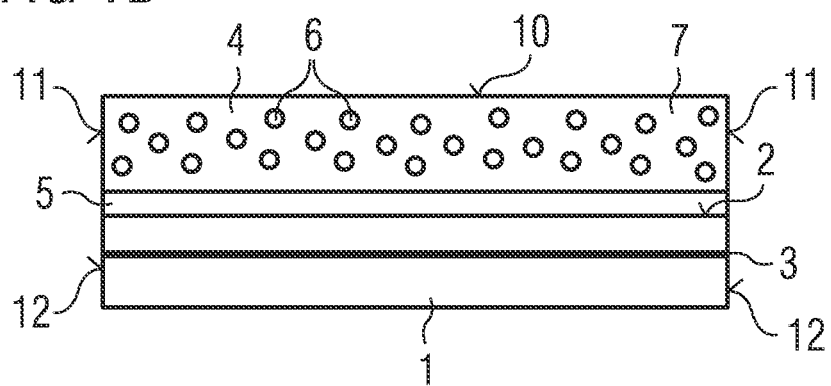
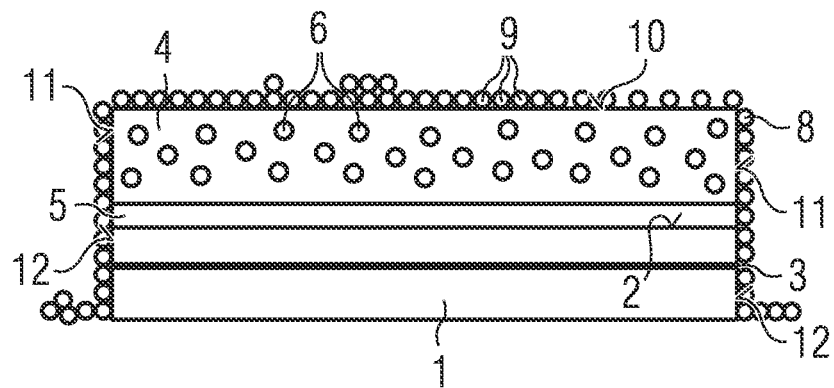

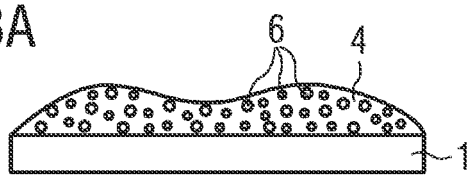
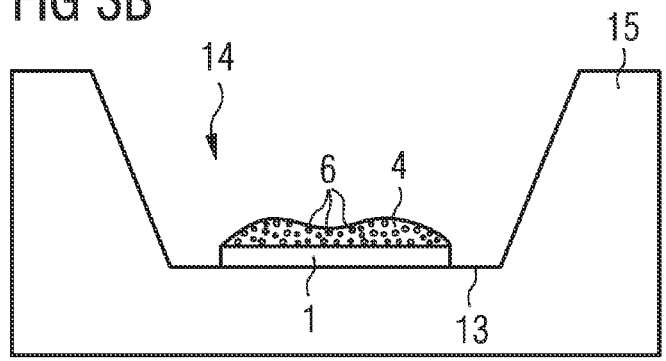
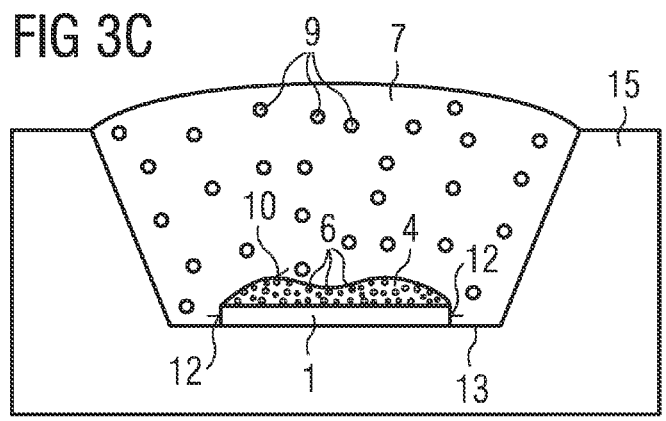
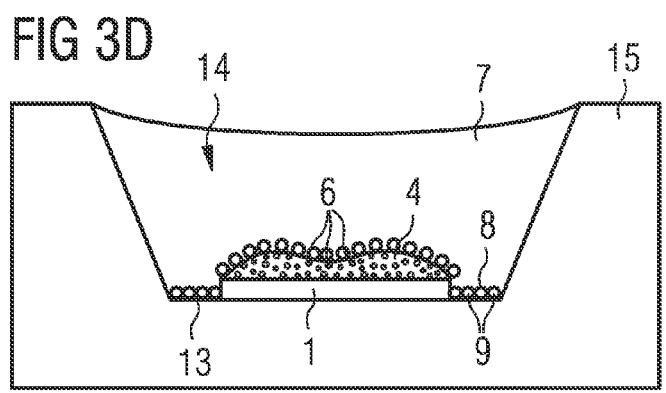

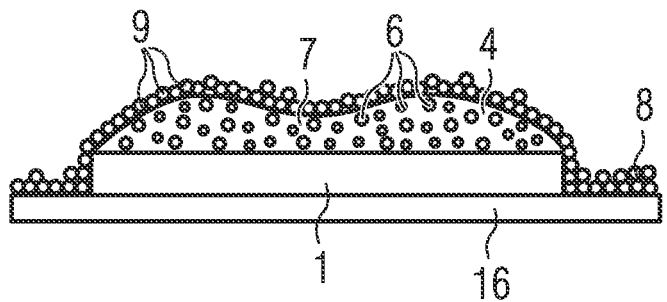
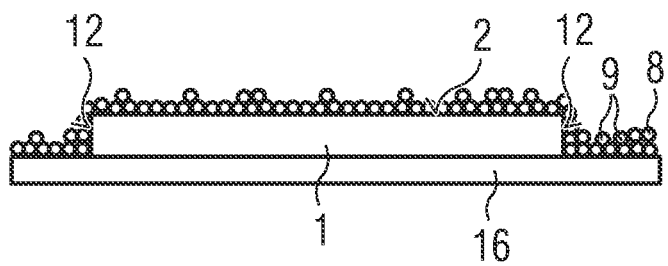
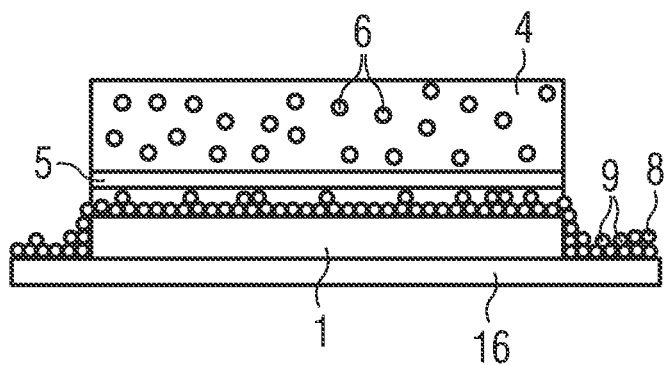

METHOD FOR PRODUCING A SEMICONDUCTOR CHIP EMITTING RADIATION, SEMICONDUCTOR CHIP EMITTING RADIATION, AND COMPONENT EMITTING RADIATION

This patent application is a national phase filing under section 371 of PCT/EP2011/070863, filed Nov. 23, 2011, which claims the priority of German patent application 10 2010 053 362.9, filed Dec. 3, 2010, each of which is incorporated herein by reference in its entirety.

TECHNICAL FIELD

The invention relates to a method for producing a radiation-emitting semiconductor chip, to a semiconductor chip and to a radiation-emitting component.

BACKGROUND

German Patent Publication No. DE 102 61 428 A1 describes a semiconductor body, on which a plurality of wavelength-converting layers are applied, which convert radiation from the semiconductor body into different wavelength ranges. The wavelength-converting layers are here arranged in succession, in such a way that the wavelengths, into which the semiconductor body radiation is in each case converted, reduce starting from the semiconductor body in the emission direction thereof.

SUMMARY OF THE INVENTION

Embodiments of the present invention provide a method for producing a radiation-emitting semiconductor chip for a radiation-emitting component having elevated efficiency. Further embodiments of the present invention provide a radiation-emitting semiconductor chip and a radiation-emitting component having elevated efficiency.

A method for producing a radiation-emitting semiconductor chip for a component having elevated efficiency is disclosed.

A semiconductor body is intended to emit electromagnetic radiation of a first wavelength range from a radiation exit face.

A first wavelength-converting layer with a first wavelength conversion material, which converts radiation of the first wavelength range into radiation of a second wavelength range, is applied over the radiation exit face of the semiconductor body. The latter is applied using sedimentation or electrophoresis.

A second wavelength-converting layer with a second wavelength conversion material, which converts radiation of the first wavelength range into radiation of a third wavelength range, is applied over the radiation exit face of the semiconductor body. The second wavelength-converting layer is produced in a separate method step and then applied or is applied using sedimentation, electrophoresis or printing.

The term electrophoresis denotes a method in which particles, for example of the wavelength conversion material, are accelerated by means of an electrical field, such that a layer of said particles is deposited on a provided surface, for example the radiation exit face of the semiconductor body. In general, the surface to be coated is provided in an electrophoresis bath, which contains the particles intended to form the wavelength-converting layer.

An electrophoretically deposited wavelength-converting layer can be deposited on electrically conductive, semiconducting and insulating surfaces.

One characterizing feature of an electrophoretically deposited wavelength-converting layer is that generally all surfaces exposed to the electrophoresis bath are completely coated with the wavelength-converting layer. A further characterizing feature of an electrophoretically deposited wavelength-converting layer is that said layer generally has a particle density greater than or equal to 30 vol. %, particularly preferably greater than 50 vol. %.

In general, the structure of an electrophoretically deposited wavelength-converting layer is additionally dependent on the conductivity of the surface on which the wavelength-converting layer is applied. In general, the particles of an electrophoretically deposited wavelength-converting layer are in direct contact with one another.

The term "particle density" here relates to volume. The particle density within the wavelength-converting layer is established by determining the number of particles within a cross-sectional area of the wavelength-converting layer.

The semiconductor body may for example also be coated with a wavelength-converting layer at wafer level by means of electrophoresis. In this case, the entire wafer comprising the individual semiconductor bodies is exposed to the electrophoresis bath. After coating with the wavelength-converting layer, the wafer is then singulated into individual semiconductor chips, for example by sawing. It is furthermore also possible for the individual semiconductor body or a semiconductor body arranged on a carrier or in the recess in a component package to be provided with a wavelength-converting layer by means of electrophoresis.

In general, the wavelength-converting layer, which is produced by electrophoresis, is fixed by a bonding agent after the electrophoresis process. The bonding agent may, for example, be silicone or epoxide or a hybrid material. A hybrid material is in this case a material which comprises at least two main components, one of these main components being a silicone or an epoxide. A hybrid material may furthermore comprise precisely two main components, for example, the first main component being an epoxide and the second main component being a silicone.

A spin-on glass, for example a polysiloxane, may also be used as a bonding agent for fixing an electrophoretically deposited wavelength-converting layer.

If, directly after the electrophoretic deposition of one wavelength-converting layer, a further wavelength-converting layer is applied to the electrophoretically deposited wavelength-converting layer, it is generally possible to dispense with fixing the electrophoretically deposited wavelength-converting layer.

In addition to the main components, the hybrid material may comprise further constituents in the form of auxiliary substances, such as for instance bluing agents. However, such constituents generally constitute a small proportion by mass of the hybrid material, the hybrid material being made up predominantly of the main components.

A wavelength-converting layer applied by means of an electrophoresis method preferably has a thickness amounting to a maximum of 60 µm.

In general, the structure of a wavelength-converting layer deposited using a sedimentation method is additionally dependent on the volume over the surface area on which the wavelength-converting layer is applied. In general, the particles of a wavelength-converting layer deposited by sedimentation are in direct contact with one another.

In a sedimentation method, particles of the wavelength conversion material are introduced into a potting material. The radiation exit face of the semiconductor body is provided for example, in the recess in a component package, which is filled with the potting material, a thinned potting material or another liquid. The particles of the wavelength conversion material then settle by gravity at least on the radiation exit face of the semiconductor body, in the form of a wavelength-converting layer. Settling of the particles may also be accelerated by centrifugation. As a rule, the use of a thinned potting material also accelerates the sedimentation process. Once the particles have settled, the potting material is cured.

It is additionally possible to apply the semiconductor body to a carrier, which is then surrounded by an auxiliary cavity, into which the potting material is introduced with the wavelength conversion material. Once the wavelength conversion material has settled, the potting material is cured and the auxiliary cavity is removed again. It is also feasible to provide an entire wafer, which comprises a plurality of semiconductor bodies, with a wavelength-converting layer by a sedimentation method using an auxiliary cavity.

A characterizing feature of a wavelength-converting layer, applied using a sedimentation method, is that all the surfaces on which the particles may settle by gravity are coated with the wavelength-converting layer.

A further characterizing feature of a wavelength-converting layer deposited using sedimentation is as a rule that said layer has a particle density of between 20 vol. % and 35 vol. %, limit values included.

A wavelength-converting layer produced by a sedimentation method preferably has a thickness amounting to a maximum of 60 μm.

A printing process suitable for producing a wavelength-converting layer is for example screen printing or stencil printing. A composition is generally printed which comprises a potting material as described above, into which particles of the wavelength conversion material have been introduced.

A wavelength-converting layer produced using a printing method generally has a particle density, relative to the same color location, which is distinctly lower than that of a wavelength-converting layer produced using an electrophoresis method or a sedimentation method.

A wavelength-converting layer produced using a printing method particularly preferably has a particle density of between 25 vol. % and 45 vol. %, limit values included.

A wavelength-converting layer produced by means of screen printing preferably has a thickness of between 20 μm and 60 μm, limit values included.

A wavelength-converting layer produced by means of template printing preferably has a thickness of between 20 μm and 150 μm, limit values included.

A wavelength-converting layer produced using a printing method generally comprises a surface, said surface of the layer following the particles of the wavelength conversion material. As a rule, in the case of the printed wavelength-converting layer only a few particles of the wavelength conversion material are in direct contact with one another.

If the second wavelength-converting layer is produced in a separate method step, one of the following methods is preferably performed: injection molding, sintering. In other words, the second wavelength-converting layer is preferably an injection-molded layer or a ceramic.

A wavelength-converting layer in the form of a ceramic preferably has a thickness of between 50 μm and 2 mm, limit values included.

A wavelength-converting layer in the form of a ceramic has a particle density of between 95 vol. % and 100 vol. %, limit values included.

In the case of an injection-molded wavelength-converting layer, particles of the wavelength conversion material are generally introduced into a potting material, as has already been described above.

The potting material with the introduced particles of the wavelength conversion material is then injection-molded in the form of a layer.

An injection-molded wavelength-converting layer generally likewise has a particle density, relative to the same color location, which is distinctly lower than that of a wavelength-converting layer produced using an electrophoresis method or a sedimentation method.

Particularly preferably, an injection-molded wavelength-converting layer has a particle density of between 10 vol. % and 55 vol. %, limit values included.

An injection-molded wavelength-converting layer which has a thickness of approx. 50 μm preferably has a particle density of between 22 vol. % and 55 vol. %, limit values included.

An injection-molded wavelength-converting layer which has a thickness of approx. 110 μm preferably has a particle density of between 10 vol. % and 30 vol. %, limit values included.

An injection-molded wavelength-converting layer preferably has a thickness of between 50 μm and 150 μm, limit values included.

An injection-molded wavelength-converting layer generally has a comparatively defined shape due to the predetermined mold.

According to one embodiment of the method, the two wavelength-converting layers are produced using different methods.

In addition to the above-described method, the first and/or the second wavelength-converting layer may also be produced using one of the following methods: spraying of the wavelength conversion material, jetting of the wavelength conversion material.

A wavelength-converting layer produced by spraying preferably has a thickness of between 20 μm and 60 μm, limit values included. The particle density of a wavelength-converting layer produced by means of spraying is preferably between 20 vol. % and 35 vol. %, limit values again being included.

A wavelength-converting layer produced by jetting preferably has a thickness of between 50 μm and 300 μm, limit values included. The particle density of a wavelength-converting layer produced by means of jetting is preferably between 2 vol. % and 55 vol. %, limit values again being included.

The first and/or second wavelength-converting layer may also be a layer formed by a glass, in which particles of a wavelength conversion material have been embedded. Such a wavelength-converting layer preferably has a thickness of between 50 μm and 300 μm, limit values included. The particle density of a wavelength-converting layer formed by a glass, into which particles of a wavelength conversion material have been introduced, preferably amounts to between 2 vol. % and 55 vol. %, limit values included.

The first and/or second wavelength-converting layer may also be a layer produced by casting a potting material, particles of a wavelength conversion material having been introduced into the potting material. Such a wavelength-converting layer preferably has a thickness of between 200 μm and 400 μm, limit values included. The particle density of such a layer preferably amounts to between 0.5 vol. % and 2 vol. %, limit values included.

A separately manufactured wavelength-converting layer, applied subsequently for example to the radiation exit face of the semiconductor body or to the first wavelength-converting layer, may be fixed by means of a joining layer. The joining layer may, for example, comprise silicone or consist of silicone.

The first wavelength-converting layer and the second wavelength-converting layer preferably form a common boundary surface.

According to one embodiment of the radiation-emitting semiconductor chip, one of the two wavelength-converting layers, i.e., either the first wavelength-converting layer or the second wavelength-converting layer, is applied in direct contact to the radiation exit face of the semiconductor body.

The first wavelength-converting layer particularly preferably comprises a single first wavelength conversion material. The second wavelength-converting layer also particularly preferably comprises a single second wavelength conversion material. The spatial separation of the wavelength conversion materials into different layers may advantageously increase the efficiency of a radiation-emitting component comprising the semiconductor chip, since in this way for example the reabsorption of radiation already converted by the one wavelength conversion material may be reduced by the other wavelength conversion material.

The first wavelength conversion material and/or the second wavelength conversion material is/are particularly preferably selected from the following group: rare earth metal-doped garnet, rare earth metal-doped alkaline earth metal sulfides, rare earth metal-doped thiogallates, rare earth metal-doped aluminates, rare earth metal-doped orthosilicates, rare earth metal-doped chlorosilicates, rare earth metal-doped alkaline earth silicon nitrides, rare earth metal-doped oxynitrides and rare earth metal-doped aluminum oxynitrides, rare earth metal-doped silicon nitrides.

Oxides, nitrides, sulfides, selenides and silicon oxynitrides may additionally be used as the first and/or second wavelength conversion material.

The particles of the first and/or second wavelength conversion material preferably have a diameter of between 2 µm and 20 µm, limit values included.

It should be noted at this point that the present method is not limited to the application of precisely two wavelength-converting layers, but rather it is possible, according to the present invention, to apply further wavelength-converting layers to the semiconductor body using the methods described herein.

According to a further preferred embodiment of the radiation-emitting semiconductor chip, the wavelength-converting layer with the wavelength conversion material which converts radiation of the first wavelength range into a longer wavelength range than the other wavelength conversion material is arranged closer to the semiconductor body than the other wavelength-converting layer. This advantageously prevents radiation that has already been converted from being absorbed by a subsequent wavelength-converting layer, so reducing radiation output.

Furthermore, a comparatively large quantity of heat arises in particular during conversion into long wavelength radiation due to the large Stoke's shift, which quantity of heat may be dissipated efficiently from the wavelength conversion material through arrangement in the vicinity of the semiconductor body, since the semiconductor body serves as a heat sink.

According to one embodiment of the semiconductor chip, particles of the second wavelength conversion material exhibit a particle density of between 10 vol. % and 55 vol. %, limit values included. A wavelength-converting layer, in which the particles of the wavelength conversion material exhibit a particle density of between 10 vol. % and 55 vol. %, may be produced in particular by injection molding or printing.

According to one embodiment of the semiconductor chip, the side faces of the semiconductor body are completely covered with the first wavelength-converting layer. Such a wavelength-converting layer may be produced in particular using electrophoresis.

According to a further embodiment of the semiconductor chip, the side faces of the wavelength-converting layer arranged closer to the semiconductor body are completely covered by the other wavelength-converting layer. Such a wavelength-converting layer may likewise be produced in particular using electrophoresis.

Coverage of the side faces of the one wavelength-converting layer and/or the side faces of the semiconductor body advantageously contributes to reducing any decrease in the efficiency of a radiation-emitting component with the semiconductor chip caused by primary radiation of the first wavelength range exiting laterally from the semiconductor body and/or the wavelength-converting layer.

It is furthermore possible, in this way, to reduce non-uniformities of color in the emission pattern, such as for example rings or stripes, and optionally package ageing, if the semiconductor chip is used in a package.

According to one embodiment of the method, the semiconductor body is applied to a carrier or in the recess of a component package and the surface of the carrier or at least of the bottom of the recess is completely covered with the first wavelength-converting layer. This is generally the case if the wavelength-converting layer is produced by means of sedimentation or electrophoresis.

The first and/or the second wavelength conversion material preferably only partially convert(s) the radiation of the semiconductor body. The unconverted radiation of the semiconductor body is particularly preferably mixed with the converted radiation of the wavelength conversion materials such that the semiconductor chip emits polychromatic radiation with a color location in the white range of the CIE standard chromaticity diagram.

The semiconductor body particularly preferably emits radiation from the blue spectral range, i.e., the first wavelength range in particular comprises blue radiation.

A semiconductor body which emits blue radiation is generally based on a nitride-compound semiconductor material. Nitride-compound semiconductor materials are compound semiconductor materials which contain nitrogen and originate from the system $In_xAl_yGa_{1-x-y}N$ with $0 \leq x \leq 1$, $0 \leq y \leq 1$ and $x+y \leq 1$.

According to one embodiment of the semiconductor chip, the semiconductor body emits blue radiation, which is converted by one of the wavelength conversion materials into radiation from the red spectral range. The wavelength conversion material in question is particularly preferably the second wavelength conversion material. The second wavelength-converting layer with the second wavelength conversion material is here particularly preferably applied directly to the radiation exit face of the semiconductor body. In this embodiment the other wavelength conversion material preferably converts a further part of the blue radiation of the semiconductor body into radiation from the green spectral range.

According to a further preferred embodiment of the semiconductor chip, the semiconductor body emits blue radiation, which is converted by the first wavelength conversion material of the first wavelength-converting layer preferably into radiation of the yellow spectral range. The blue light of the semiconductor body here preferably mixes with the converted light in such a way that the semiconductor chip emits electromagnetic radiation with a color location in the warm white range of the CIE standard chromaticity diagram.

In this embodiment it is also possible for the second wavelength conversion material to convert a further part of the blue radiation likewise into radiation from the yellow spectral range. It is alternatively also possible for the second wavelength conversion material to convert a further part of the blue radiation into radiation from the red or green spectral range.

Furthermore, a third wavelength conversion material may also be used.

According to a further embodiment of the semiconductor chip, the semiconductor body emits blue radiation, which is converted by the first wavelength conversion material into radiation from the green spectral range. The unconverted blue light of the semiconductor body preferably mixes with the converted light in such a way that the semiconductor chip emits white light. Such radiation-emitting semiconductor chips are suitable in particular for display backlighting.

It is moreover also possible for the semiconductor body to emit ultraviolet radiation which is converted by the first and/or second wavelength conversion material virtually completely into visible light.

According to one embodiment of the semiconductor chip, the wavelength conversion material which scatters the radiation of the semiconductor body to a greater degree than the other wavelength conversion material is arranged closer to the semiconductor body. The wavelength-converting layer with the wavelength conversion material which scatters the radiation of the semiconductor body to a greater degree than the other wavelength conversion material is particularly preferably applied in direct contact to the radiation exit face of the semiconductor body. This may be associated with advantages of efficiency for a component having the semiconductor chip, since the reflectivity of the semiconductor body is generally better than that of the component package or the carrier.

A semiconductor chip manufactured according to the present method and therefore comprising one wavelength-converting layer produced electrophoretically or by means of sedimentation, and comprising a further wavelength-converting layer with a further wavelength conversion material, generally advantageously emits radiation with a comparatively uniform color location as a function of the solid angle.

Features described in relation to the production method may likewise be applied to the semiconductor chip and vice versa.

BRIEF DESCRIPTION OF THE DRAWINGS

Further advantageous embodiments and further developments of the invention are revealed by the exemplary embodiments described below in connection with the figures.

FIGS. 1A to 1C show schematic sectional representations of a radiation-emitting semiconductor chip during different stages of the method, according to a first exemplary embodiment;

FIGS. 3A to 3D show schematic sectional representations of a radiation-emitting component during different stages of the method, according to an exemplary embodiment;

FIG. 4 is a schematic sectional representation of a radiation-emitting semiconductor chip according to a further exemplary embodiment;

FIGS. 5A and 5B are schematic sectional representations of a radiation-emitting semiconductor chip at various stages of the method, according to a further exemplary embodiment.

Figure 2A:
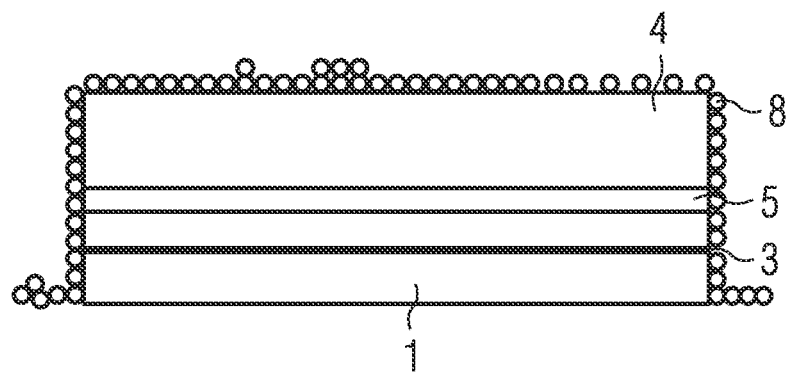
FIGS. 2A and 2B each show a schematic sectional representation of a radiation-emitting semiconductor chip, according to two further exemplary embodiments.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

DETAILED DESCRIPTION OF ILLUSTRATIVE EMBODIMENTS

In the method according to the exemplary embodiment of FIGS. 1A to 1C, in a first method step a semiconductor body 1 is provided which is intended to emit electromagnetic radiation of a first wavelength range from one radiation exit face 2 (FIG. 1A). The semiconductor body 1 comprises an active, radiation-generating zone 3, which is intended to generate electromagnetic radiation.

The active zone 3 preferably comprises a pn-junction, a double heterostructure, a single quantum well or particularly preferably a multi quantum well structure (MQW) for generating radiation. The term quantum well structure does not here make any statement with regard to the dimensionality of the quantization. It thus encompasses inter alia quantum troughs, quantum wires and quantum dots and any combination of these structures.

In the present case, the active zone 3 generates electromagnetic radiation from the blue spectral range.

In a further method step, a separately produced second wavelength-converting layer 4 is applied to the radiation exit face 2 of the semiconductor body 1 (FIG. 1B). The second wavelength-converting layer 4 is fixed with a joining layer 5, which in the present case comprises silicone or consists of silicone, to the semiconductor body 1.

The second wavelength-converting layer 4 comprises a second wavelength conversion material 6, which converts radiation of the first wavelength range into radiation of a third wavelength range, which is different from the first wavelength range. The second wavelength conversion material 6 is embedded in a potting material 7, which may be for example silicone, epoxide or a hybrid material. The second wavelength-converting layer 4 is produced in the present case by means of an injection molding method.

In a further method step, a first wavelength-converting layer 8 is applied in direct contact to the second wavelength-converting layer 4 using an electrophoresis method (FIG. 1C). The first wavelength-converting layer 8 comprises a first wavelength conversion material 9, which converts radiation of the first wavelength range into radiation of a second wavelength range, which is different from the first and third wavelength ranges.

Since the first wavelength-converting layer 8 is applied using an electrophoresis method, said layer advantageously completely covers not only a major face 10 of the second wavelength-converting layer 4 but also the side faces 11 of the second wavelength-converting layer and the side faces 12 of the semiconductor body 1. In this way, the efficiency of a component having the semiconductor body 1 may be increased, since radiation exiting laterally from the semiconductor body 1 or the second wavelength-converting layer 4 is not lost.

In the present case, the second wavelength-converting layer 4 comprises a second wavelength conversion material 6, which is suitable for converting part of the radiation from the blue spectral range, which is generated by the semiconductor body 1 in the active zone 3 thereof, into radiation from the red spectral range.

The first wavelength conversion material 9 of the first wavelength-converting layer 8 is moreover suitable for converting a further part of the blue radiation of the semiconductor body 1 into radiation from the yellow spectral range. The respectively converted radiation fractions of the first wavelength-converting layer 8 and of the second wavelength-converting layer 4 mix together in the present case with the other unconverted blue radiation to yield warm white mixed radiation.

Instead of an injection-molded lamina as second wavelength-converting layer 4, as in the exemplary embodiment of FIG. 1C, a ceramic lamina may for example also be used, as illustrated schematically in FIG. 2A. A ceramic exhibits the advantage, for example, that it is particularly good at dissipating to the outside heat which arises during wavelength conversion.

Figure 2B:
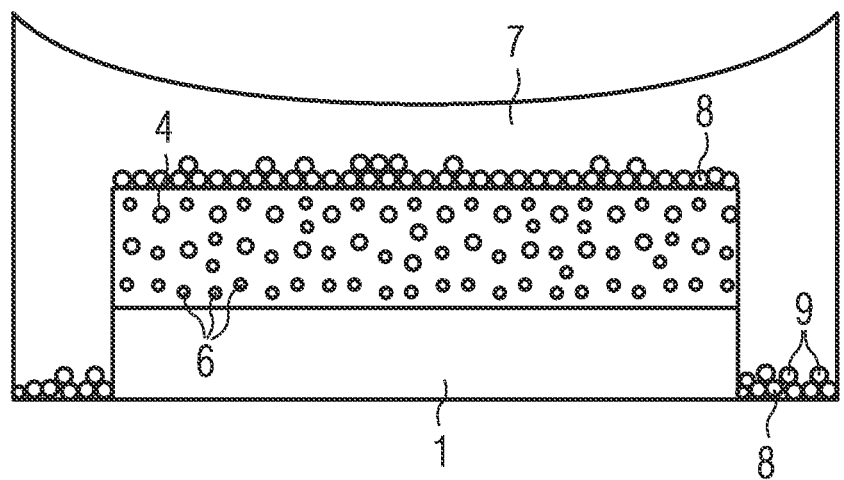

In contrast to the semiconductor chip according to the exemplary embodiment of FIG. 1C, in the case of the semiconductor chip according to the exemplary embodiment of FIG. 2B the first wavelength-converting layer 8 is applied to the second wavelength-converting layer 4 by means of sedimentation. In contrast to the semiconductor chip according to FIG. 1C, the side faces 12 of the semiconductor body 1 and the side faces 11 of the second wavelength-converting layer 4 are therefore free of the first wavelength-converting layer 8. Moreover, the semiconductor chip is introduced into a potting material 7, from which the particles of the first wavelength conversion material 9 are sedimented.

Carrying out a sedimentation method according to a first exemplary embodiment is described below with reference to FIGS. 3A to 3D.

In a first step, a second wavelength-converting layer 4 is printed onto a semiconductor body 1 (FIG. 3A). An example of a suitable printing method is screen printing. A potting material 7 is printed, into which particles of the second wavelength conversion material 6 have been introduced.

In a next step, the semiconductor body 1 is mounted with the second wavelength-converting layer 4 on the bottom 13 of a recess 14 of a component package 15 (FIG. 3B).

In a next step, the recess 14 is filled with a potting material 7, into which particles of a first wavelength conversion material 9 have been introduced (FIG. 3C). After a time, the particles of the first wavelength conversion material 9 settle by sedimentation on the major face 10 of the second wavelength-converting layer 4 and on the bottom 13 of the recess 14. In this case, the side faces 12 of the semiconductor body 1 remain free of the first wavelength-converting layer 8 (FIG. 3D).

Furthermore, it is also possible for just the semiconductor body to be provided with a wavelength-converting layer by sedimentation, without mounting in a component package. To this end, a carrier may advantageously be used with a temporary auxiliary recess.

In contrast to the semiconductor chip according to the exemplary embodiment of FIG. 3D, in the semiconductor chip according of FIG. 4 the first wavelength-converting layer 8 is applied to the printed second wavelength-converting layer 4 using an electrophoresis method. In this case, unlike in the exemplary embodiment of FIG. 3D, the side faces 12 of the semiconductor body 1 are also covered with the first wavelength-converting layer 8. To carry out the electrophoresis method, the semiconductor body 1 may be applied to a carrier 16. The free surface of the carrier 16 is also completely covered with the first wavelength-converting layer 8.

In the method according to FIGS. 5A and 5B, a first wavelength-converting layer 8 is applied by electrophoresis to the radiation exit face 2 and to the side faces 12 of a semiconductor body 1 provided on a carrier 16 (FIG. 5A). The free surface of a carrier 16 is here also completely covered with the first wavelength-converting layer 8.

In a further method step (FIG. 5B), a further separately produced second wavelength-converting layer 4 is applied to the first wavelength-converting layer 8 (FIG. 5B). The second wavelength-converting layer 4 has for example been produced using an injection molding method. Alternatively, it may also be a ceramic lamina. The second wavelength-converting layer 4 is fixed to the first wavelength-converting layer 4 by means of a joining layer 5.

The first wavelength-converting layer 8 of the semiconductor chip according to FIG. 5B preferably comprises a first wavelength conversion material 9, which converts blue radiation of the semiconductor body 1 into red radiation. Since the electrophoretically deposited first wavelength-converting layer 8 is arranged in direct contact with the semiconductor body 1 and exhibits a comparatively high particle density, it is in this way possible for heat arising in the first wavelength-converting layer 8 due to the Stoke's shift to be readily output to the semiconductor body. The second wavelength conversion material 6 preferably converts blue radiation of the semiconductor body 1 into yellow radiation.

Figure 6:
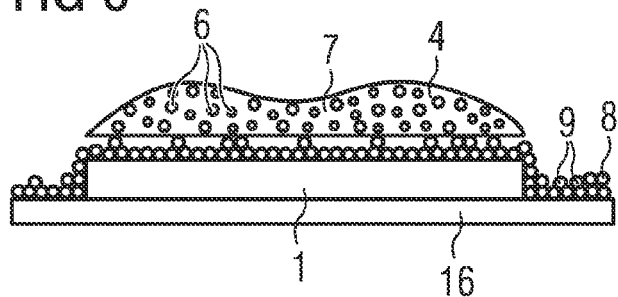
FIGS. 6 to 9 are schematic sectional representations of radiation-emitting semiconductor chips according to further exemplary embodiments.

In contrast to the semiconductor chip according to FIG. 5B, with the semiconductor chip according to the exemplary embodiment of FIG. 6 the second wavelength-converting layer 4 is produced by printing.

Figure 7:
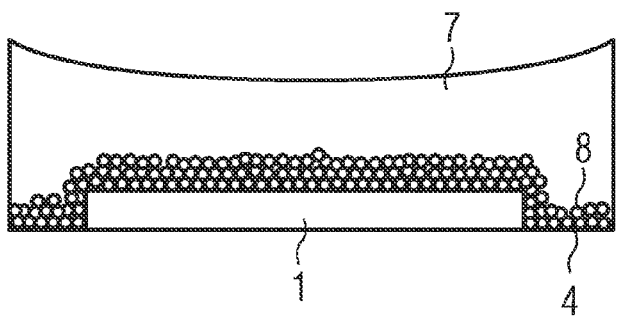

In contrast to the semiconductor chip according to FIG. 5B, in the exemplary embodiment according to FIG. 7 the first wavelength-converting layer 8 is applied by sedimentation to the second wavelength-converting layer 4.

Figure 8:
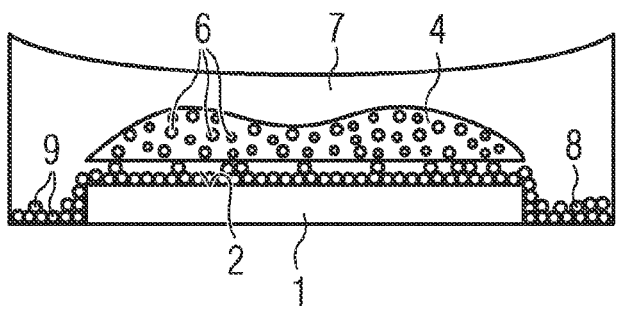

FIG. 8 shows a schematic sectional representation of a semiconductor chip with a semiconductor body 1, to whose radiation exit face 2 a first wavelength-converting layer 8 has been applied by sedimentation, on which a second wavelength-converting layer 4 is further arranged in direct contact, the latter having been produced by means of printing.

Figure 9:
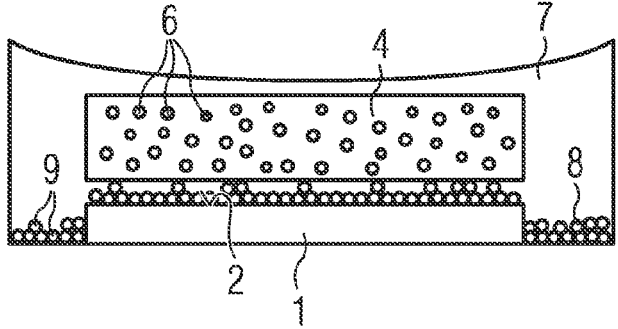

In contrast to the semiconductor chip of FIG. 8, with the semiconductor chip of FIG. 9 the second wavelength-converting layer 4 is produced in a separate method step by means of injection molding and applied to the first wavelength-converting layer 8 produced using a sedimentation method.

The invention claimed is:
1. A method for producing a radiation-emitting semiconductor chip, the method comprising:
provided a semiconductor body configured to emit electromagnetic radiation of a first wavelength range from a radiation exit face;
applying a first wavelength-converting layer with a first wavelength conversion material, which converts radiation of the first wavelength range into radiation of a second wavelength range, over the radiation exit face of the semiconductor body, the first wavelength-converting layer being applied by sedimentation or electrophoresis; and applying a second wavelength-converting layer with a second wavelength conversion material, which converts radiation of the first wavelength range into radiation of a third wavelength range, over the radiation exit face of the semiconductor body, the second wavelength-converting layer either being produced in a separate method step and then applied or being applied by: sedimentation, electrophoresis, or printing;

wherein, if the first and/or second wavelength converting layer is applied by electrophoresis, then the layer has particle density higher or equal to 50 Vol %; and wherein, if the first and/or second wavelength converting layer is applied by sedimentation, then the layer has a particle density between 20 Vol % and 35 Vol %, limits included.

2. The method according to claim 1, wherein the second wavelength converting layer is produced in a separate method step.

3. The method according to claim 2, wherein the second wavelength is the second wavelength-converting layer is applied by injection molding or sintering.

4. The method according to claim 1, wherein the first wavelength-converting layer and the second wavelength-converting layer form a common boundary surface.

5. The method according to claim 1, wherein the first wavelength-converting layer or the second wavelength-converting layer is applied in direct contact to the radiation exit face of the semiconductor body.

6. The method according to claim 1, wherein the first wavelength conversion material and/or the second wavelength conversion material comprises a material selected from the group consisting of rare earth metal-doped garnet, rare earth metal-doped alkaline earth metal sulfides, rare earth metal-doped thiogallates, rare earth metal-doped aluminates, rare earth metal-doped orthosilicates, rare earth metal-doped chlorosilicates, rare earth metal-doped alkaline earth silicon nitrides, rare earth metal-doped oxynitrides and rare earth metal-doped aluminum oxynitrides, rare earth metal-doped silicon nitrides, wavelength conversion material system based on oxides, wavelength conversion material system based on nitrides, wavelength conversion material system based on sulfides, wavelength conversion material system based on selenides, and wavelength conversion material system based on silicon oxynitrides.

7. The method according to claim 1, wherein the wavelength-converting layer with the wavelength conversion material which converts radiation of the first wavelength range into a longer wavelength range than the other wavelength conversion material is arranged closer to the semiconductor body than the other wavelength-converting layer with the other wavelength conversion material.

8. The method according to claim 1, wherein particles of the second wavelength conversion material or particles of the first wavelength conversion material within the respective wavelength-converting layer have a particle density greater than or equal to 20 vol. %.

9. The method according to claim 1, wherein particles of the second wavelength conversion material exhibit a particle density of between 10 vol. % and 100 vol. %, limit values included.

10. The method according to claim 1, wherein the particles of the first and/or second wavelength conversion material exhibit a diameter of between 2 µm and 20 µm, limit values included.

11. The method according to claim 1, wherein side faces of the semiconductor body are completely covered with the first wavelength-converting layer.

12. The method according to claim 1, wherein side faces of the wavelength-converting layer arranged closer to the semiconductor body are completely covered by the other wavelength-converting layer.

13. A radiation-emitting semiconductor chip, which is produced by a method according to claim 1.

14. The radiation-emitting semiconductor chip according to claim 13, wherein the second wavelength-converting layer is arranged in direct contact with the radiation exit face of the semiconductor body and the first wavelength-converting layer is applied in direct contact to the second wavelength-converting layer, wherein the first wavelength-converting layer completely covers one major face of the second wavelength-converting layer, side faces of the second wavelength-converting layer and side faces of the semiconductor body.

15. The radiation-emitting semiconductor chip according to claim 13, wherein the first wavelength-converting layer is arranged in direct contact with the radiation exit face and side faces of the semiconductor body and the second wavelength-converting layer is applied in direct contact to the first wavelength-converting layer.

16. A radiation-emitting component, comprising a semiconductor chip according to claim 1 arranged on a carrier or in the recess of a component package.

17. A method for producing a radiation-emitting semiconductor chip, the method comprising:
providing a semiconductor body configured to emit electromagnetic radiation of a first wavelength range from a radiation exit face,
applying a first wavelength-converting layer with a first wavelength conversion material, which converts radiation of the first wavelength range into radiation of a second wavelength range, over the radiation exit face of the semiconductor body, the first wavelength-converting layer applied by sedimentation or electrophoresis, and
applying a second wavelength-converting layer with a second wavelength conversion material, which converts radiation of the first wavelength range into radiation of a third wavelength range, over the radiation exit face of the semiconductor body, the second wavelength-converting layer either being produced in a separate method step and then applied or being applied by sedimentation, electrophoresis, or printing.

* * * * *